(12) United States Patent
Kim et al.

(10) Patent No.: US 11,804,371 B2
(45) Date of Patent: Oct. 31, 2023

(54) SUBSTRATE TREATMENT APPARATUS AND METHOD OF PERFORMING TREATMENT PROCESS ON SUBSTRATE

(71) Applicant: SEMES CO., LTD., Cheonan-si (KR)

(72) Inventors: Do Yeon Kim, Yongin-si (KR); Se Hoon Oh, Cheonan-si (KR); Won Geun Kim, Goyang-si (KR); Ju Mi Lee, Seoul (KR); Ho Jong Hwang, Hwaseong-si (KR); Pil Kyun Heo, Hwaseong-si (KR); Hyun Yoon, Hwaseong-si (KR); Choong Hyun Lee, Hwaseong-si (KR); Hyun Goo Park, Seongnam-si (KR)

(73) Assignee: SEMES CO., LTD., Cheonan-si (KR)

( * ) Notice: Subject to any disclaimer, the term of this patent is extended or adjusted under 35 U.S.C. 154(b) by 459 days.

(21) Appl. No.: 16/920,418

(22) Filed: Jul. 2, 2020

(65) Prior Publication Data

US 2021/0013029 A1  Jan. 14, 2021

(30) Foreign Application Priority Data

Jul. 8, 2019 (KR) .................. 10-2019-0082284

(51) Int. Cl.
*H01L 21/02* (2006.01)
*H01L 21/67* (2006.01)
*B05C 11/08* (2006.01)
*G03F 7/16* (2006.01)

(52) U.S. Cl.
CPC .... *H01L 21/02057* (2013.01); *H01L 21/6715* (2013.01); *B05C 11/08* (2013.01); *G03F 7/162* (2013.01); *H01L 21/02282* (2013.01); *H01L 21/67051* (2013.01)

(58) Field of Classification Search
CPC ........... H01L 21/67051; H01L 21/6715; H01L 21/02282; H01L 51/0003; G03F 7/162; B05C 11/08
See application file for complete search history.

(56) References Cited

U.S. PATENT DOCUMENTS

| 7,319,195 | B2 | 1/2008 | Kohayashi et al. |
| 8,815,048 | B2 | 8/2014 | Miyagi et al. |
| 2007/0207706 | A1* | 9/2007 | Takahashi ......... H01L 21/68728 451/28 |

(Continued)

FOREIGN PATENT DOCUMENTS

| JP | 2005-183941 | 7/2005 |
| JP | 2008-098594 A | 4/2008 |

(Continued)

OTHER PUBLICATIONS

Office Action from the Japan Patent Office dated Aug. 30, 2022.

*Primary Examiner* — Dah-Wei D. Yuan
*Assistant Examiner* — Stephen A Kitt

(57) ABSTRACT

Provided is a substrate treatment apparatus including a treatment container equipped with a conductive member. The conductive member is made of a material having a lower resistivity than that of the treatment container. The conductive member prevents a rise of an electric potential of the treatment container, which is caused by charging during treatment of a substrate, thereby preventing the substrate from being contaminated and damaged by particles and electrostatic arcing.

19 Claims, 6 Drawing Sheets

(56) References Cited

U.S. PATENT DOCUMENTS

2008/0070418 A1\* 3/2008 Miyagi ............ H01L 21/67051
257/E21.486

FOREIGN PATENT DOCUMENTS

| KR | 10-1147656 B1 | 5/2012 |
|----|---------------|--------|
| KR | 10-1910796 B1 | 10/2018 |
| WO | 2019-017489 | 1/2019 |

\* cited by examiner

SUBSTRATE TREATMENT APPARATUS AND METHOD OF PERFORMING TREATMENT PROCESS ON SUBSTRATE

CROSS REFERENCE TO RELATED APPLICATION

The present application claims priority to Korean Patent Application No. 10-2019-0082284, filed Jul. 8, 2019, the entire contents of which is incorporated by reference herein for all purposes.

BACKGROUND OF THE INVENTION

1. Field of the Invention

The present invention relates to a substrate treatment apparatus for treating a substrate with liquid and a method of treating a substrate using same apparatus.

2. Description of Related Art

In manufacturing a semiconductor or display device, an apparatus that applies a treatment liquid onto a substrate such as a semiconductor wafer or glass and treats the surface of the substrate with the liquid is used. An example of such an apparatus is a substrate cleaning apparatus that removes contaminants on the surface of the substrate.

A substrate cleaning apparatus, which is a kind of substrate treatment apparatus, is configured to supply a treatment liquid to a substrate supported by a substrate supporting unit from a liquid supply unit and to recover the treatment liquid after the completion of treatment with a treatment container. The substrate supporting unit is accommodated in the treatment container.

The treatment container is made of an insulating material such as fluorine resin (for example, polytetrafluoroethylene (PTFE)) to prevent corrosion by a treatment liquid and to ensure thermal stability in a high temperature environment. Therefore, in the process of recovering the treatment liquid supplied to the substrate accommodated in the treatment container, triboelectric charging may occur due to friction between the treatment liquid and the surface of the container, resulting in inductive charging on the substrate. For example, when deionized water (DIW) is used as a treatment liquid, a fluorine resin treatment container is negatively charged, and deionized water is positively charged.

Due to this charging phenomenon, particles existing in the vicinity of the substrate are attracted to the substrate, thereby contaminating the substrate. In addition, arcing of static electricity is likely to occur on the substrate.

DOCUMENTS OF RELATED ART

Patent Document (Patent Document 1) Korean Patent No. 10-1147656 (May 24, 2012)
(Patent Document 2) Korean Patent No. 10-1910796 (Oct. 25, 2018)

SUMMARY OF THE INVENTION

Objectives of the present invention are to provide a substrate treatment apparatus and a substrate treatment method capable of preventing liquid treatment defects (for example, substrate contamination and arching) attributable to triboelectric charging and inductive charging.

Problems to be solved by the present invention are not limited thereto, and other problems that are not mentioned above but can be solved by the present invention will be clearly understood by those skilled in the art from the following description.

According to an embodiment of a first aspect of the present invention, there is provided a substrate treatment apparatus including: a substrate supporting unit configured to support a substrate; a liquid supply unit that supplies a treatment liquid such as deionized water onto a surface of the substrate supported on the substrate supporting unit; a treatment container configured to accommodate the substrate supporting unit and to recover the treatment liquid used to treat the substrate, and a conductive member provided in the treatment container and made of a lower specific electric resistivity than the treatment container.

The treatment container may have a wall portion surrounding the substrate supporting unit and the wall portion may be provided with the conductive member.

The conductive member may be embedded in the wall portion. Alternatively, the conductive member may be mounted on a surface of the wall portion. The conductive member may be a single conductive band configured to extend along the entire circumference of the wall portion, or a plurality of conductive islands arranged at intervals along a circumferential direction of the wall portion.

The wall portion may include: a main wall having a nesting recess to accommodate the conductive member in an outer surface or an inner surface thereof; and a recess cover configured to open and close an entrance of the nesting recess.

The nesting recess is configured to accommodate both of the conductive member and the recess cover. When the recess cover is accommodated in the nesting recess in a closed state, a surface of the nesting cover is flush with a surface of the wall portion at a periphery portion of the nesting recess, The nesting recess may be hermetically sealed by a seal provided between the recess cover and the wall portion, thereby preventing a foreign matter from infiltrating into the nesting recess. The conductive member may be grounded. The treatment container may be made of an insulating material including fluorine resin. The conductive member may be a metal mesh body or a metal plate.

According to another embodiment of the second aspect of present invention, there is provided a substrate treatment apparatus including: a substrate supporting unit including multiple supporting pins supporting a substrate to be treated from underneath and multiple chuck pins supporting the substrate from the sides, the substrate supporting unit being configured to rotate about a vertical shaft; a liquid supply unit that supplies a treatment liquid onto a surface of the substrate supported by the substrate supporting unit; a treatment container configured to accommodate the substrate supporting unit and to collect the treatment liquid scattering from the surface of the substrate, the treatment container being made of an insulating material and being negatively charged by friction between the treatment liquid and a surface thereof; and a conductive member provided in the treatment container and made of a material having a lower specific electric resistivity than that of the treatment container, the conductive member preventing an electric potential of the treatment container from rising. The treatment container includes a wall portion surrounding the substrate supporting unit and a bottom portion on which the wall portion stands, in which the wall portion retains the conductive member. The wall portion may include: a main wall having a nesting recess to accommodate the conductive member in an outer surface or an inner surface thereof; and a recess cover configured to open and close an entrance of the nesting recess.

According to one embodiment of a second aspect of the present invention, there is provided a substrate treatment method including: preparing the substrate treatment apparatus according to one embodiment of the first aspect, the apparatus including the substrate supporting unit, the liquid supply unit, the treatment container, and the conductive member; placing a substrate to be supported by the substrate supporting unit; supplying a treatment liquid onto a surface of the substrate supported by the substrate supporting unit from the liquid supply unit; and treating the substrate with the treatment liquid while collecting the used treatment liquid in the treatment container, wherein in the treating of the substrate, a rise of an electric potential of the treatment container is suppressed by the conductive member.

Technical solutions to the problems occurring in the related art will be clarified with reference to the following description of embodiments and the accompanying drawings. In addition, various solutions other than the solutions mentioned above may be further suggested in the following description.

According to one embodiment of the present invention, in a process of treating a substrate with a treatment liquid supplied from a liquid supply unit while collecting the treatment liquid in a treatment container, it is possible to suppress the electric potential of the treatment container from being increased due to a charging effect during the treatment process, thereby protecting the substrate against electrostatic arcing.

The effect of the present invention is not limited thereto, and other effects that are not mentioned can be clearly understood, by those skilled in the art, from the following description and the accompanying drawings.

DESCRIPTION OF THE PREFERRED EMBODIMENTS

Hereinbelow, preferred embodiments of the present invention will be described with reference to the accompanying drawings. It is noted that throughout the drawings referenced to describe an embodiment of the present invention, the size of components, the thickness of lines, etc. may be exaggerated for clarity. In addition, the terms used herein to describe the embodiments of the present invention are selected considering functions performed in the present invention and thus may be called other words depending on the intentions of users and operators and on customs. Therefore, the terms should be interpreted in the context of the present specification.

Figure 1:
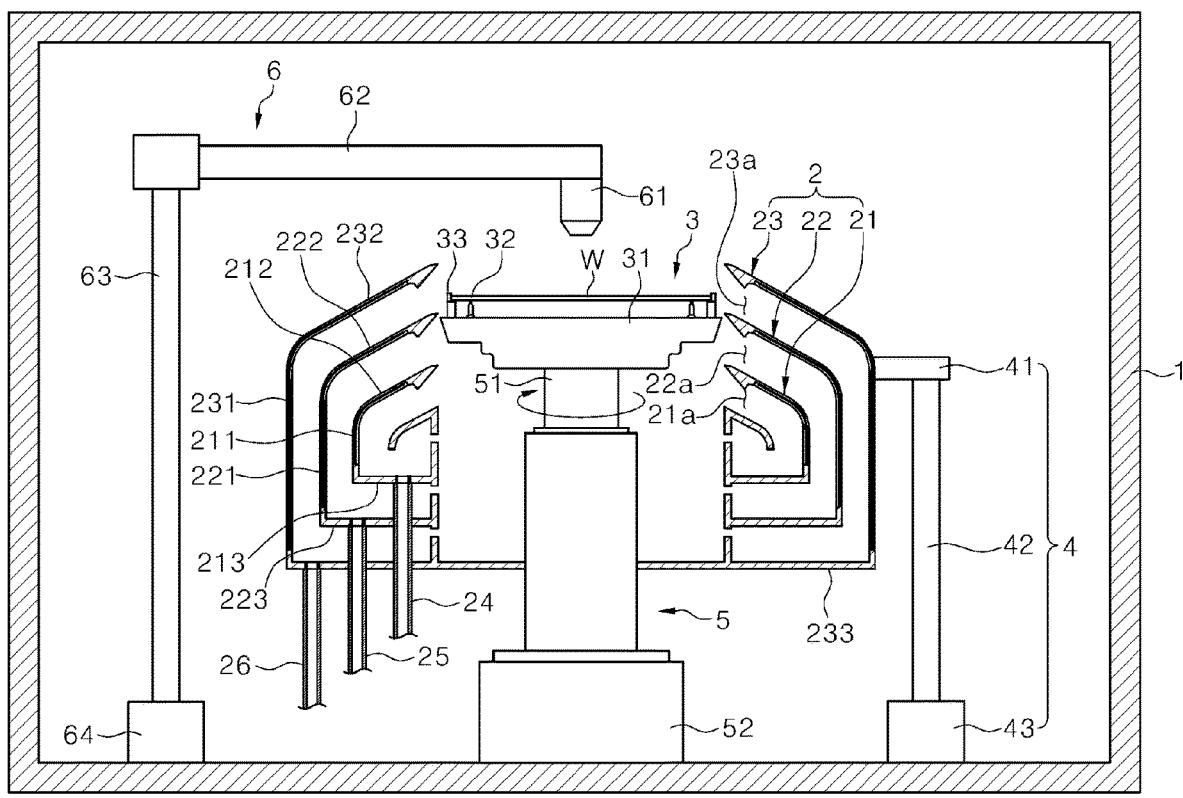
FIG. 1 is a cross-view of a substrate treatment apparatus according to a first embodiment of the present invention.

FIG. 1 is a cross-view schematically illustrating the construction of a substrate treatment apparatus according to a first embodiment of the present invention.

Referring to FIG. 1, the substrate treatment apparatus according to the first embodiment of the present invention includes a chamber 1, a treatment container 2, a substrate supporting unit 3, a lift drive unit 4, a rotary drive unit 5, a liquid supply unit 6, and a conductive member 7.

The chamber 1 defines space in which liquid treatment on a substrate W is performed. The liquid treatment process is performed at normal pressure or vacuum pressure. A vacuum pump (not illustrated) is connected to the chamber 1 to create a vacuum pressure environment in the chamber 1.

The treatment container 2 is installed inside the chamber 1. The treatment container 2 has a cup-like shape. That is, the treatment container has an open upper end and a treatment space connected to the open upper end. The substrate supporting unit 3 is accommodated in the treatment space of the treatment container 2. A substrate W is supported on the substrate supporting unit 3. The liquid supply unit 6 supplies a treatment liquid to the surface of the substrate W and the treatment container 2 is configured to collect the treatment liquid that is supplied from the liquid supply unit 6 and is then used to treat the surface of the substrate.

The treatment container 2 includes a first cup member (or first treatment container) 21 that defines the treatment space, a second cup member (or second treatment container) 22 that surrounds the first cup member 21 with a predetermined gap therebetween, and a third cup member 23 (or third treatment container) that surrounds the second cup member 22 with a predetermined gap therebetween. That is, the second cup member 22 is disposed between the first cup member 21 which is the innermost cup member and the third cup member 23 which is the outermost cup member. That is, the treatment container 2 may be composed of a plurality of cup members 21, 22, and 23. The cup members 21, 22, and 23 may collect different treatment liquids, respectively. The first cup member 21 has a first opening 21a through which the treatment liquid to be collected for recovery is introduced into the first cup member 21. An opening between the first cup member 21 and the second cup member 22 serves as a second opening 22a through which the treatment liquid to be collected for recovery is introduced into the second cup member 22. An opening between the second cup member 22 and the third cup member 23 serves as a third opening 23a through which the treatment liquid to be collected for recovery is introduced into the third cup member 23.

The first cup member 21 is composed of a first wall portion 211+212 and a first bottom portion 213. The first wall portion 211+212 is configured to surround the treatment space. The first wall portion 211+212 includes a first lower wall 211 having a cylinder shape with a uniform diameter and a uniform thickness and a first upper wall 212 having an overall truncated cone shape. That is, the first upper wall 212 is tapered to the top base from the bottom base. The first upper wall 212 is provided on top of the first lower wall 211. The first lower wall 211 and the first upper wall 212 are implemented as an integrated wall. The upper end (i.e., rim) of the first upper wall 212 is provided with a first protrusion which is ring-shaped. The first protrusion protrudes downward from the lower surface of the upper end portion of the first upper wall 212. The first lower wall 211 is configured to stand on the first bottom portion 213.

The second cup member 22 is composed of a second wall portion 221+222 and a second bottom portion 223. The second wall portion 221+222 is positioned a predetermined distance away from the first wall portion 211+212 and is configured to surround the first wall portion 211+212. The second wall portion 221+222 includes a second lower wall 221 having a cylinder shape with a uniform diameter and a uniform thickness and a second upper wall 222 having an overall truncated cone shape. That is, the second upper wall 212 is tapered to the top base from the bottom base. The second upper wall 212 is provided on top of the second lower wall 221. The second lower wall 221 and the second upper wall 222 are implemented as an integrated wall. The upper end of the second upper wall 222 is higher than the upper end of the first upper wall 212. However, the diameter of the upper end of the second upper wall 222 is the same or similar to the diameter of the upper end of the first upper wall 212. Thus, a gap naturally formed between the upper end of the first upper wall 212 and the upper end of the second upper wall 222 is the second opening 22a serving as an inlet. The upper end (i.e., rim) of the second upper wall 222 is provided with a second protrusion which is ring-shaped. The second protrusion protrudes downward from the lower surface of the upper end portion of the second upper wall 222. The second bottom portion 223 is positioned under the first bottom portion 213, with a predetermined distance therebetween. The second lower wall 221 is configured to stand on the second bottom portion 223.

The third cup member 23 is composed of a third wall portion 231+232 and a third bottom portion 233. The third wall portion 231+232 is positioned a predetermined distance away from the second wall portion 221+222 and is configured to surround the second wall portion 221+222. The third wall portion 231+232 includes a third lower wall 231 having a cylinder shape with a uniform diameter and a uniform thickness and a third upper wall 232 having an overall truncated cone shape. That is, the third upper wall 232 is tapered to the top base from the bottom base. The third upper wall 232 is provided on top of the third lower wall 231. The third lower wall 231 and the third upper wall 232 are implemented as an integrated wall. The upper end of the third upper wall 232 is higher than the upper end of the second upper wall 222. However, the diameter of the upper end of the third upper wall 232 is the same or similar to the diameter of the upper end of the second upper wall 222. Thus, a gap naturally formed between the upper end of the second upper wall 222 and the upper end of the third upper wall 232 is the third opening 23a serving as an inlet. The upper end (i.e., rim) of the third upper wall 232 is provided with a third protrusion which is ring-shaped. The third protrusion protrudes downward from the lower surface of the upper end portion of the third upper wall 232. The third bottom portion 233 is positioned under the second bottom portion 223, with a predetermined distance therebetween. The third lower wall 231 is configured to stand on the third bottom portion 233.

The bottom portions 213, 223, and 233 of the respective cup members 21, 22, and 23 are connected with liquid drain pipes 24, 25, and 26, respectively. The treatment liquid collected in each of the cup members 21, 22, and 23 through a corresponding one of the openings 21a, 22a, and 23a is drained through a corresponding one of the liquid drain pipes 24, 25, and 26. The treatment liquid drained through the liquid drain pipes 24, 25, and 26 may undergo a regeneration process performed by a liquid regeneration apparatus (not illustrated) so that it can be recycled.

The treatment container 2 is made of an insulating material. Each of the cup members 21, 22, and 23 is made of an insulating material which is excellent in chemical resistance and heat resistance. Preferably, the insulating material is fluorine resin (specifically, poly tetrafluoroethylene (PTFE)) which is advantageous in terms of strong resistance to chemicals and high stability in high temperature environments.

The substrate supporting unit 3 supports a substrate during a liquid treatment process. The substrate supporting unit 3 includes a spinning chuck composed of a spinning head 31, supporting pins 32, and chuck pins 33.

The spinning head 31 is installed to rotate around a vertical shaft. The spinning head 31 has a circular plate member. The spinning head 31 is installed in the treatment space defined within the treatment container 2. The spinning head 31 can be rotated around the vertical shaft by a rotary drive unit 5.

The supporting pins 32 are configured to protrude from the upper surface of the spinning head 31, thereby supporting a substrate from underneath of the substrate.

The chuck pins 33 are arranged a longer distance away from the center of the spinning head 31 than the supporting pins 32. The chuck pins 33 support the periphery of the substrate while the spinning head 31 is rotated by the rotary drive unit 5, thereby preventing the substrate from being displaced in a horizontal direction.

The chuck pins 33 can be moved in a radial direction of the spinning head 31 by a pin drive unit (not illustrated). Thus, the chuck pins 33 can be shuttled between a standby position and a supporting position. The standby position is a position farther from the center of the spinning head 31 than the supporting position. The chuck pins 33 stay in the standby position while a substrate is being loaded on or unloaded from the upper surface of the spinning head 31. On the other hand, when the loading is finished, the chuck pins 33 are moved to the supporting position to support the substrate. During treatment of the loaded substrate, the chuck pins 33 stay in the supporting position. When staying in the supporting position, the chuck pins 33 are in contact with the circumference of the substrate.

The lift drive unit 4 vertically moves the treatment container 2. The lift drive unit 4 can collectively move a set of cup members 21, 22, and 23 or independently move each of the cup members 21, 22, and 23. When the treatment container 2 is lifted up or down by the lift drive unit 4, the relative height of each of the cup members 21, 22, and 23 with respect to the substrate support unit 3 can be changed. The lift drive unit 4 includes a bracket 41, a lifting shaft 42, and a shaft lifting part 43.

The bracket 41 may be mounted outside the treatment container 2. Specifically, the bracket 41 is mounted on the outer wall surface of the third wall portion 231+232 constituting the third cup member 23 which is the outermost cup member. The lifting shaft 42 is combined with the bracket 41. The lifting shaft 42 is installed to vertically extend. The shaft lifting part 43 is configured to move up and down the lifting shaft 42 by using power from a power source.

The lift drive unit 4 moves down the treatment container 2 to prevent interference between a substrate transport robot and the treatment container 2 when the substrate is loaded on or unloaded from the upper surface of the spinning head 31 by the substrate transport robot. In addition, the lift drive unit 4 can adjust the height of the treatment container 2 by moving up or down the treatment container 2. In this case, the treatment container 2 is moved up or down such that a predetermined treatment liquid can be introduced into a targeted opening of the openings 21*a*, 22*a*, and 23*a*, depending on the kind of treatment liquid supplied to the substrate from the liquid supply unit 6.

Alternatively, the lift drive unit 4 may be configured to move up and down the substrate supporting unit 3 instead of the treatment container 2.

The rotary drive unit 5 includes a drive shaft 51 coupled to the center of the bottom surface of the spinning head 31, and a shaft rotating unit 52 configured to rotate the drive shaft 51 using power from a power source. When the drive shaft 51 is rotated by the shaft rotating unit 52, the spinning head 31 rotates in the same direction as the drive shaft 51. The substrate supported by the chuck pins 33 is also rotated in the same direction.

When the substrate is rotated by the rotary drive unit 5, the treatment liquid supplied onto the upper surface of the substrate scatters, and the scattering treatment liquid enters a predetermined opening of the openings 21*a*, 22*a*, and 23*a*.

The liquid supply unit 6 is configured to supply a treatment liquid onto the upper surface of the substrate supported by the substrate supporting unit 3. The liquid supply unit 6 includes a nozzle 61, a nozzle arm 62, an arm support 63, and a support drive unit 64.

The arm support 63 is installed inside chamber 1 but outside the treatment container 2 and is configured to vertically extend. The nozzle arm 62 is coupled to an upper end portion of the arm support 63 and is configured to extend in a horizontal direction. The nozzle 61 is disposed at a leading end of the nozzle arm 62 in such a manner to eject the treatment liquid downward. The support drive unit 64 is configured to rotate, to elevate, or to rotate and elevate the arm support 63. When the support drive unit 64 operates, the nozzle 61 performs rotary motion, vertical linear motion, or both.

In the liquid supply unit 6, the nozzle 61 is rotated around the arm support 63 by the support drive unit 64, thereby staying in a standby position or a supply position. That is, the nozzle 61 is shuttled between the standby position and the supply position by the support drive unit 64. At this time, the standby position is a position where the nozzle 61 is outside a region directly above the treatment container 2, and the supply position is a position where the nozzle 61 is within a region directly above the treatment container 2 so that the treatment liquid discharged from the nozzle 61 can be applied onto the substrate. The nozzle 61 stays in the standby position while a substrate is being loaded on or unloaded from the upper surface of the spinning head 31. On the other hand, when the loading is finished, the nozzle 61 is moved to the supply position to discharge the treatment liquid from above the substrate.

The substrate treatment apparatus is preferably equipped with a plurality of liquid supply units 6 rather than a single liquid supply unit 6. When the plurality of liquid supply units 6 is installed, each of the liquid supply units 6 may supply different types of liquid to the substrate.

The treatment liquid may be a cleaning solution such as sulfuric acid and phosphoric acid or a rinsing solution such as deionized water (DIW). The treatment liquid is transported from a liquid storage unit to the nozzle 61 through a liquid supply pipe.

The conductive member 7 can suppress static electricity attributable to the charging phenomenon in each of the cup members 21, 22, and 23 during the substrate treatment. Each of the cup members 21, 22, and 23 is equipped with its own conductive member 7. The conductive member is made of a material having a lower resistivity than that of the cup members 21, 22, and 23 made of an insulating material. The material of the conductive member 7 may be a metal such as aluminum or copper having a low resistivity.

During the surface treatment, the treatment liquid supplied to the substrate is likely to scatter around and fly into one of the cup members 21, 22 and 23 through a corresponding one of the 21*a*, 22*a*, and 23*a*, and the introduced treatment liquid flows down along the inner wall surface of a corresponding one of the first, second, and third wall portions 211+212, 221+222, and 231+232. At this time, on the inner wall surface of the corresponding one of the first, second, and third wall portions 211+212, 221+222, and 231+232, frictional charging occurs due to friction between the treatment liquid and the inner wall surface. When the cup members 21, 22, and 23 are made of fluorine resin which is a material that is ranked low in the triboelectric charging sequence, the inner wall surface of the cup member is easily negatively charged and the treatment liquid (for example, deionized water) is positively charged. In this case, induction charging easily occurs on the substrate. However, in the substrate treatment apparatus according to the first embodiment of the present invention, since the capacitance is increased due to the conductivity of the conductive member 7 provided in each of the cup member 21, 22, and 23, the potential increase of the treatment container 2 is suppressed. Therefore, it is possible to prevent the substrate from being damaged by induction charging.

Figure 2:
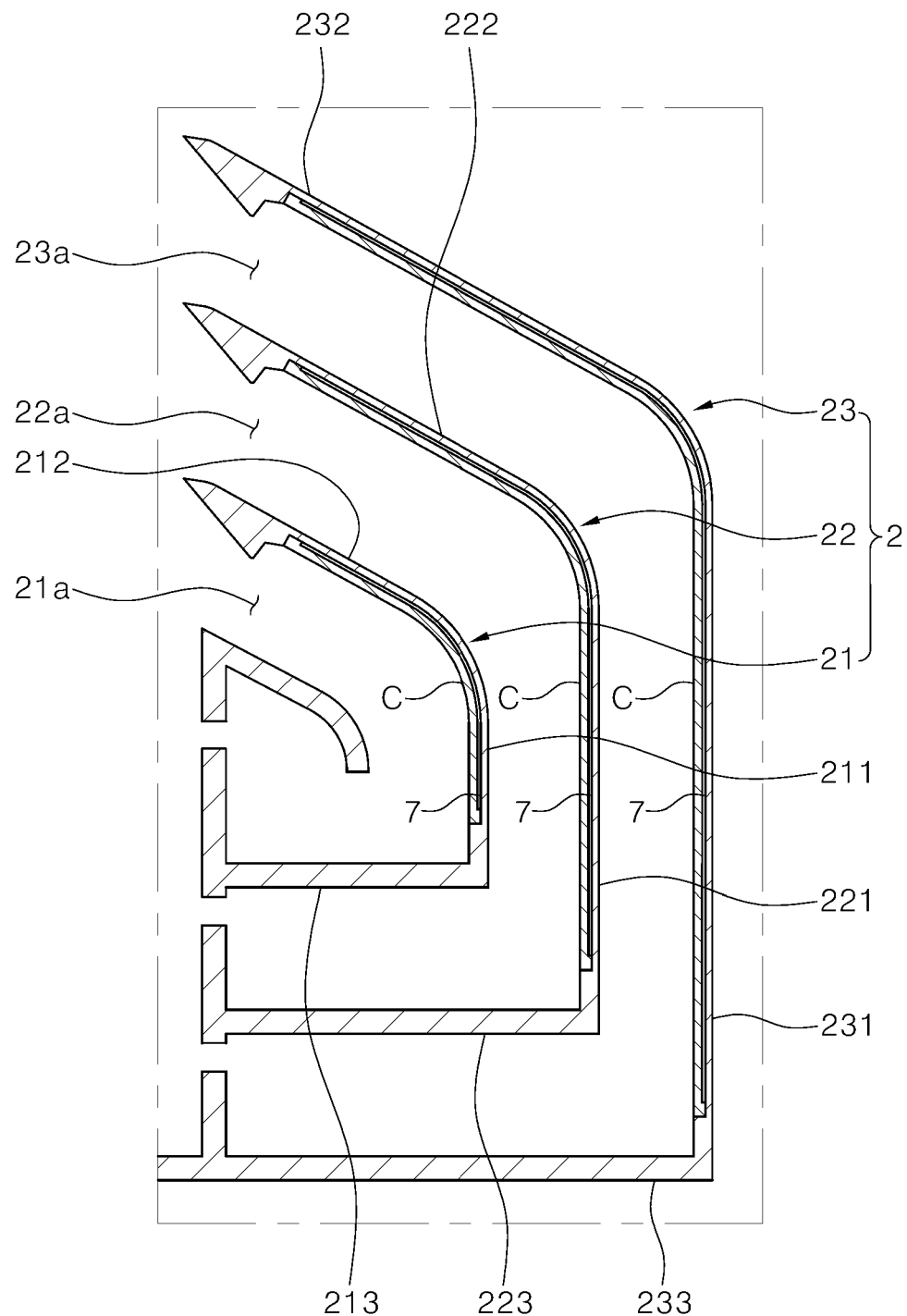
FIG. 2 is an enlarged view of a portion of a treatment container illustrated in FIG. 1.
Figure 3:
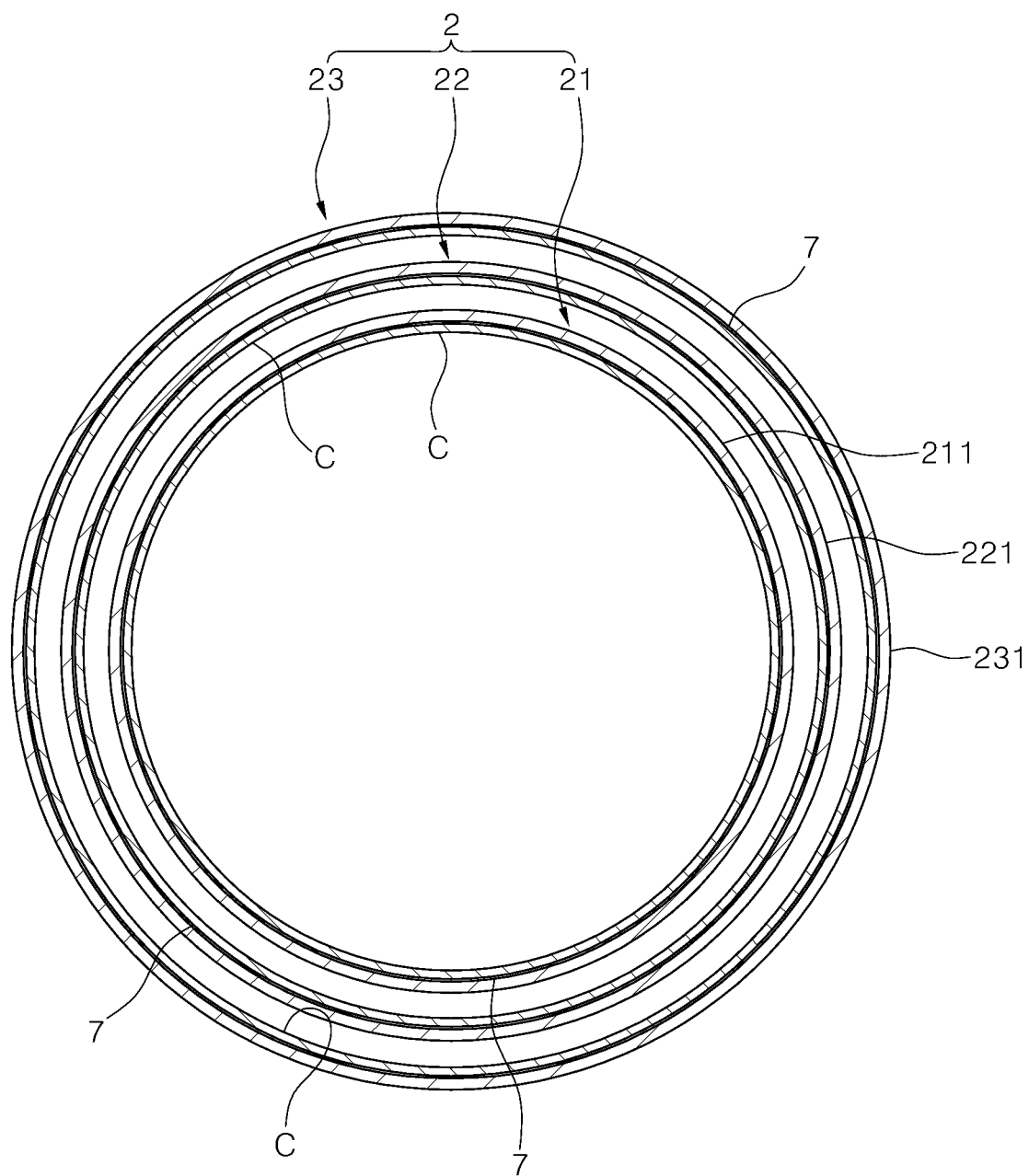
FIG. 3 is a top plan view of the treatment container illustrated in FIG. 1.
Figure 4:
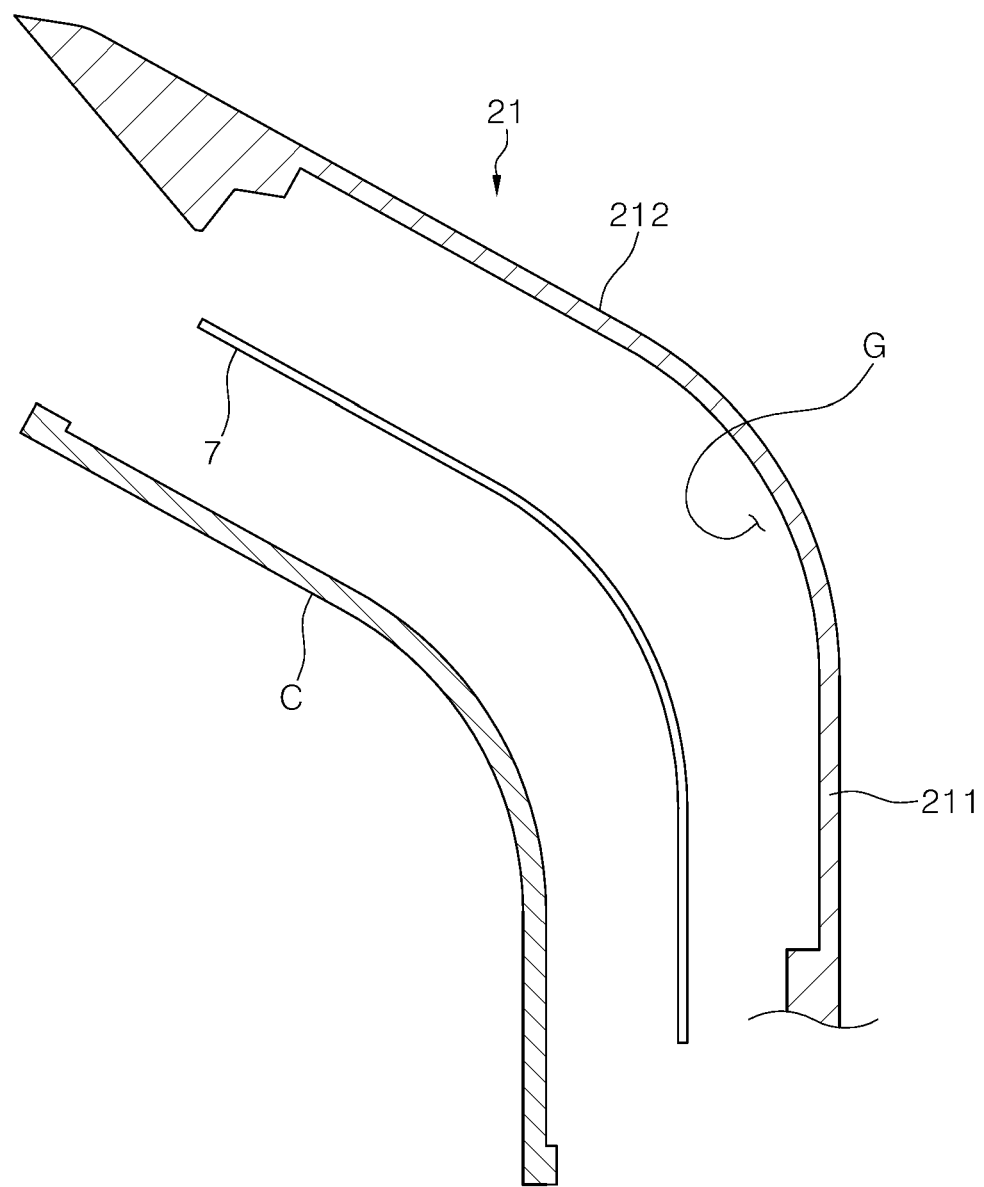
FIG. 4 is a view illustrating an assembled state of a first cup member illustrated in FIG. 2.

FIGS. 2 to 4 illustrate the treatment container 2 and the conductive member 7 provided in the treatment container 2. With reference to FIGS. 2 to 4, the conductive member 7 will be described in detail.

Each of the wall portions 211+212, 221+222, and 231+232 that respectively constitute the cup members 21, 22, and 23 is equipped with the conductive member 7. The conductive member 7 has a size that ranges from the top to bottom of each wall portion 211+212, 221+222, or 231+232. The conductive members 7 may be respectively embedded in the wall portions 211+212, 221+222, and 231+232, thereby structurally reinforcing the wall portions 211+212, 221+222, and 231+232. Each of the conductive members 7 may be formed to cover the entire circumference of a corresponding one of the wall portions 211+212, 221+222, and 231+232. Thus, each of the conductive members 7 may be composed of a cylindrical portion corresponding to the lower wall 211, 221, or 231 and a truncated cone-shaped portion corresponding to the upper wall 212, 222, or 232. The conductive member 7 is implemented with a mesh structure with a predetermined open area in terms of weight reduction of the treatment container 2. Alternatively, the conductive member 7 may be implemented with a flat plate structure or a corrugated structure in terms of improving the structural strength of the treatment container 2. Although not illustrated, the conductive member 7 is also provided in each of the bottom portions 213, 223, and 233 constituting the respective cup members 21, 22, and 23.

In order to retain the conductive members 7 in the respective wall portions 211+212, 221+222, and 231+232, each of the wall portions 211+212, 221+222, and 231+232 includes a main wall that has a nesting recess G to accommodate the conductive member 7 in an inner surface thereof and a recess cover C that closes an opening of the nesting recess G. Alternatively, the main wall may have the nesting recess G to accommodate the conductive member 7 in an outer surface thereof. Further alternatively, the main wall may have the nesting recess G in each of the inner surface and the outer surface. In this case, the inner surface and the outer surface of the main wall are provided with the conductive members 7, respectively.

Each of the nesting recess G has a size that can accommodate the conductive member 7 and the recess cover C. The recess cover C is completely received in the nesting recess G when covering the opening of the nesting recess G. At this time, the surface of the recess cover C and the surface of the main wall in the vicinity of the nesting recess G are flush with each other. Therefore, the recess cover C does not interfere with the flow of the treatment liquid flowing down along the surface of the wall portion 211+212, 221+222, or 231+232.

The recess cover C is welded to the surface of the main wall so that the nesting recess G is hermetically sealed. Thus, the treatment liquid or foreign matter flowing along the inner wall surface of each of the wall portions 211+212, 221+222, and 231+232 cannot invade into the nesting recess G. Alternatively, the periphery of the recess cover C may be sealed by an arbitrary sealing member.

When the conductive members 7 are accommodated in the respective wall portions into each of the walls 211+212, 221+222, and 231+232 as described above, the conductive members 7 can be safely protected from the treatment liquid.

In addition, each of the conductive members 7 is electrically grounded. With the configuration in which the conductive members 7 are electrically grounded, it is possible to more reliably suppress the potential increase of the treatment container 2.

In the substrate treatment apparatus according to the first embodiment of the present invention configured as described above, the capacitance of the treatment container 2 is increased due to the conductivity of the conductive members 7 provided in the respective cup members 21, 22, and 23. Because of this point, a significant increase in the potential of the treatment container 2, which is usually attributable to frictional charging, can be suppressed during the substrate treatment at a low cost while the material properties of the treatment container 2 are maintained. This results in prevention of induced charging on the substrate, thereby preventing fine patterns formed on the substrate from being damaged by particles (i.e., charged particles), electrostatic arcing, or the like.

Further, in the substrate treatment apparatus according to the first embodiment of the present invention, since the conductive members 7 are embedded in the respective cup members 21, 22, and 23, the structural strength of the treatment container 2 is enhanced.

Figure 5:
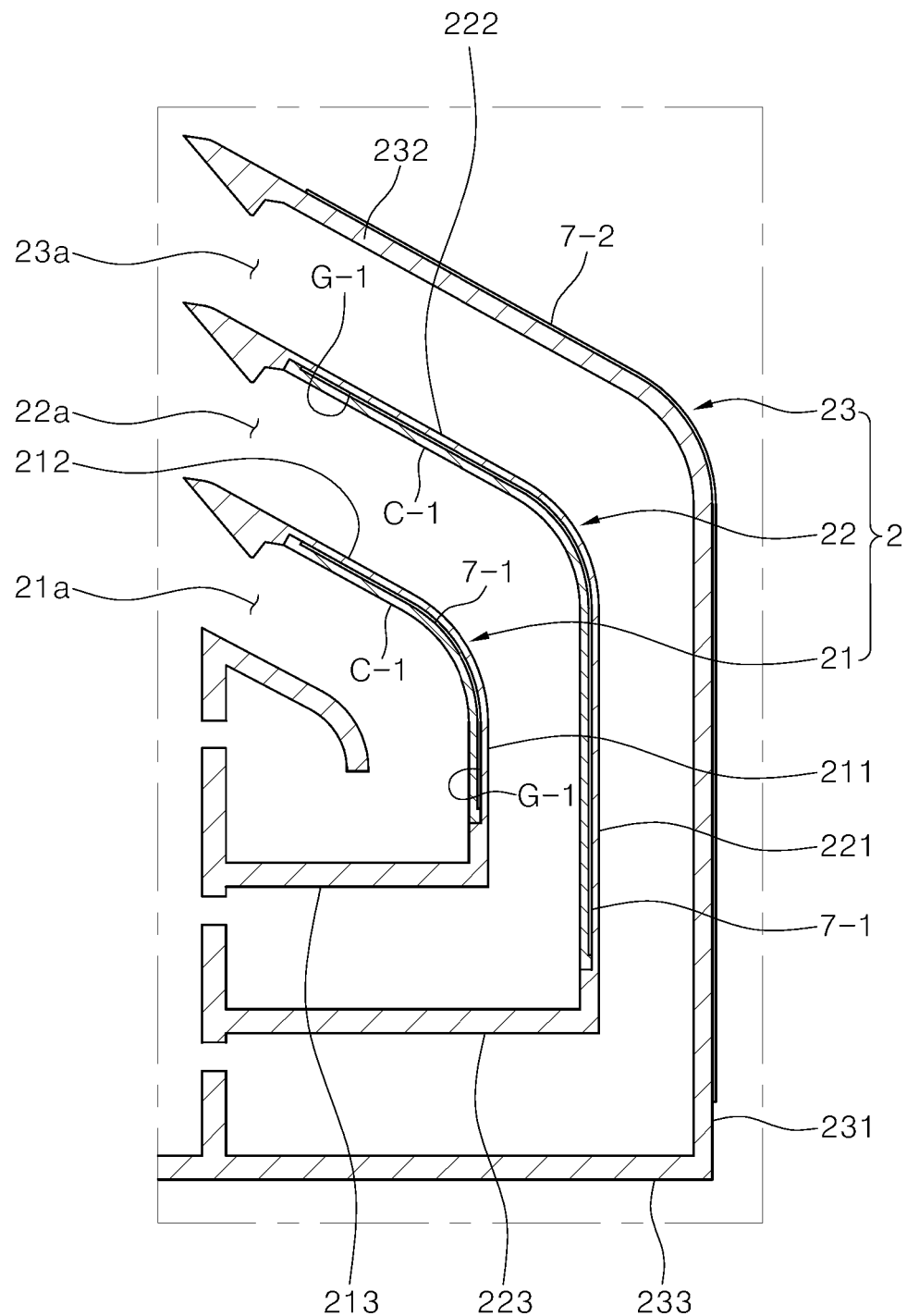
FIG. 5 is a cross-sectional view illustrating a treatment container of a substrate treatment apparatus according to a second embodiment of the present invention.
Figure 6:
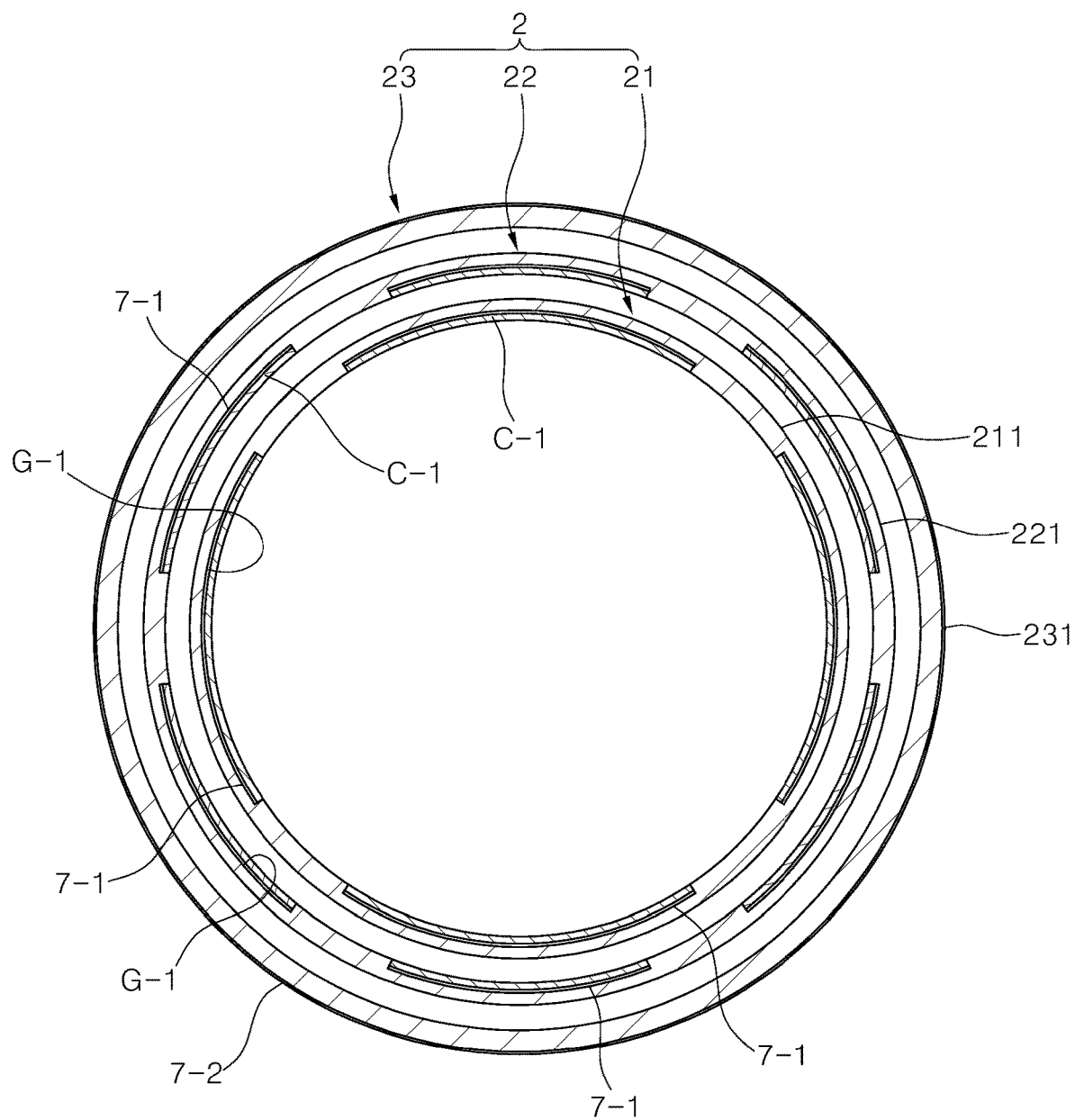
FIG. 6 is a top plan view of the treatment container illustrated in FIG. 5.

A substrate treatment apparatus according to a second embodiment of the present invention will be described with reference to FIGS. 5 and 6. FIGS. 5 and 6 illustrate a treatment container and a conductive member of the substrate treatment apparatus according to the second embodiment of the present invention. As illustrated in FIGS. 5 and 6, the substrate treatment apparatus according to the second embodiment of the present invention is almost the same as the substrate treatment apparatus according to the first embodiment of the present invention, except for the structure of the conductive member. Conductive members 7-1 and 7-2 will be described in detail below.

A first cup member 21 and a second cup member 22 are equipped with the respective conductive members 7-1 embedded in the respective wall portions 211+212 and 221+222. Each of the first and second cup members 21 and 22 is provided with multiple conductive members 7-1. The multiple conductive members 7-1 are arranged at regular intervals in a circumferential direction of each of the wall portions 211+212 and 221+222 of the respective cup members 21 and 22.

The main wall of the wall portion 211+212 of the first cup member 21 is provided with multiple nesting recesses G-1 to accommodate the respective conductive members 7-1 in an inner surface, an outer surface, or both. The opening of each of the nesting recesses G-1 is closed by a recess cover C-1. The main wall of the wall portion 221+222 of the second cup member 22 is also configured in the same manner. With this configuration in which multiple conductive members 701 are respectively inserted into multiple nesting recesses formed in the inner, outer, or both surfaces of each of the wall portions 211+212 and 221+222 of the first and second cup members 21 and 22, it is easier to manufacture and install the conductive members 7-1.

In the present embodiment, the outermost third cup member 23 has the conductive member 7-2 that is stretched over the entire outer wall surface of the third wall portion 231+232 because there is no fear that the outer wall surface of the third wall portion 231+232 comes into contact the treatment liquid.

On the other hand, in the substrate treatment apparatus according to the second embodiment of the present invention, each of the conductive members 7-1, 7-2 may be electrically grounded.

Although the embodiments of the present invention have been described above, the present invention is not limited by the disclosed embodiments and the accompanying drawings, and those skilled in the art will appreciate that various modifications and equivalents to the embodiments can be made without departing from the technical spirit of the present invention. In addition, the technical ideas described in the respective embodiments of the present invention can be implemented independently of each other or can be implemented in combination.

What is claimed is:

1. A substrate treatment apparatus comprising:
    a substrate supporting unit configured to support a substrate;
    a nozzle supplying a treatment liquid onto an upper surface of the substrate supported by the substrate supporting unit;
    a treatment container configured to accommodate the substrate supporting unit and to collect the treatment liquid supplied onto the upper surface of the substrate from the nozzle, wherein the treatment container includes a wall portion surrounding the substrate supporting unit; and
    a conductive member embedded in the wall portion of the treatment container and made of a material having a lower resistivity than a material of the treatment container,
    wherein the wall portion includes a main wall, a recess cover, and an internal space defined by the main wall and the recess cover,
    wherein the conductive member is disposed in the internal space, and
    wherein an upper end of the recess cover is directly connected to the main wall to form the internal space.

2. The apparatus according to claim 1, wherein the conductive member is implemented as a single piece surrounding a circumference of the wall portion.

3. The apparatus according to claim 1,
    wherein the conductive member is implemented as multiple discrete conductive chips, and
    wherein the multiple discrete conductive chips are arranged along a circumference of the multiple the wall portion and spaced apart from each other.

4. The apparatus according to claim 1,
wherein an internal surface of the main wall is recessed to form a first nesting recess,
wherein the conductive member contacts an entire inner surface of the first nesting recess, and
wherein the recess cover covers the first nesting recess.

5. The apparatus according to claim 4,
wherein the recess cover and the conductive member are disposed in the first nesting recess, and
wherein an outer surface of the recess cover and an outer surface of a periphery portion of the main wall are positioned on a same plane.

6. The apparatus according to claim 4, wherein a boundary between the main wall and the recess cover is sealed.

7. The apparatus according to claim 4,
wherein an internal surface of the recess cover includes a second nesting recess,
wherein the second nesting recess and the first nesting recess define the internal space of the wall portion, and
wherein the conductive member contacts an entire inner surface of the second nesting recess.

8. The apparatus according to claim 1,
wherein the main wall has a nesting recess to accommodate the conductive member in an outer surface of the nesting recess, and
wherein the recess cover covers the nesting recess.

9. The apparatus according to claim 1, wherein the conductive member is implemented as a single piece surrounding a circumference of the wall portion.

10. The apparatus according to claim 1,
wherein the conductive member is implemented as multiple discrete conductive chips, and
wherein the multiple discrete conductive chips are arranged along a circumference of the multiple the wall portion and are spaced apart from each other.

11. The apparatus according to claim 1, wherein the conductive member is grounded.

12. The apparatus according to claim 1, wherein the treatment container is made of an insulating material.

13. The apparatus according to claim 12, wherein the insulating material is formed of fluorine resin.

14. The apparatus according to claim 1, wherein the conductive member is a metal mesh member.

15. The apparatus according to claim 1, wherein the conductive member is a metal plate member.

16. The apparatus according to claim 1,
wherein the main wall includes a first vertical portion and a first inclined portion, and
wherein the recess cover includes a second vertical portion directly connected to the first vertical portion and a second inclined portion directly connected to the first inclined portion to form the internal space of the wall portion.

17. The apparatus according to claim 16,
wherein the conductive member includes a third vertical portion disposed between the first and second vertical portions, and a third inclined portion disposed between the first and second inclined portions.

18. A substrate treatment apparatus comprising:
a substrate supporting unit including supporting pins that support a bottom surface of a substrate and chuck pins supporting edges of the substrate;
a vertical shaft connected to the substrate supporting unit and configured to rotate the substrate supporting unit;
a nozzle configured to supply a treatment liquid onto an upper surface of the substrate supported by the substrate supporting unit;
a treatment container made of an insulating material to be negatively charged by friction with the treatment liquid and configured to accommodate the substrate supporting unit and to collect the treatment liquid that is supplied onto the upper surface of the substrate from the nozzle and that scatters from the upper surface of the substrate; and
a conductive member retained by the treatment container and made of a material having a lower resistivity than the insulating material of the treatment container, thereby preventing a rise of an electric potential of the treatment container,
wherein the treatment container comprises a wall portion surrounding the substrate supporting unit and a bottom portion on which the wall portion stands,
wherein the conductive member is embedded in the wall portion,
wherein the wall portion includes a main wall, a recess cover, and an internal space defined by the main wall and the recess cover,
wherein the conductive member is disposed in the internal space, and
wherein an upper end of the recess is directly connected to the main wall to form the internal space.

19. The apparatus according to claim 18,
wherein the main wall has a nesting recess to accommodate the conductive member in an outer surface of the nesting recess or an inner surface thereof, and
wherein the recess cover covers the nesting recess accommodating the conductive member.

* * * * *